United States Patent [19]
Tomer et al.

[11] Patent Number: 5,126,029
[45] Date of Patent: Jun. 30, 1992

[54] APPARATUS AND METHOD FOR ACHIEVING VIA STEP COVERAGE SYMMETRY

[75] Inventors: Yigal Tomer; Yigal Dafne, both of Jerusalem, Israel

[73] Assignee: Intel Corporation, Santa Clara, Calif.

[21] Appl. No.: 635,662

[22] Filed: Dec. 27, 1990

[51] Int. Cl.⁵ .................................... C23C 14/35
[52] U.S. Cl. .................. 204/192.12; 204/192.17; 204/298.2
[58] Field of Search ............... 204/192.12, 192.17, 204/298.2

[56] References Cited

U.S. PATENT DOCUMENTS 4,714,536 12/1987 Freeman et al. ............... 204/298.2

FOREIGN PATENT DOCUMENTS 2125440 3/1984 United Kingdom ............ 204/298.2

Primary Examiner—Aaron Weisstuch
Attorney, Agent, or Firm—Blakely, Sokoloff, Taylor & Zafman

[57] ABSTRACT

A magnetron sputtering apparatus and method for achieving via step coverage symmetry in a process for depositing a metal layer over a semiconductor substrate relies upon simultaneous rotational and lateral movements of the magnetron. When the magnetron is rotated and and moved laterally at the same time, the uniformity of the magnetic field across the target is improved significantly compared to prior art magnetron sputtering systems. Simultaneous rotational and lateral movements are achieved utilizing a planetary gear system.

6 Claims, 4 Drawing Sheets

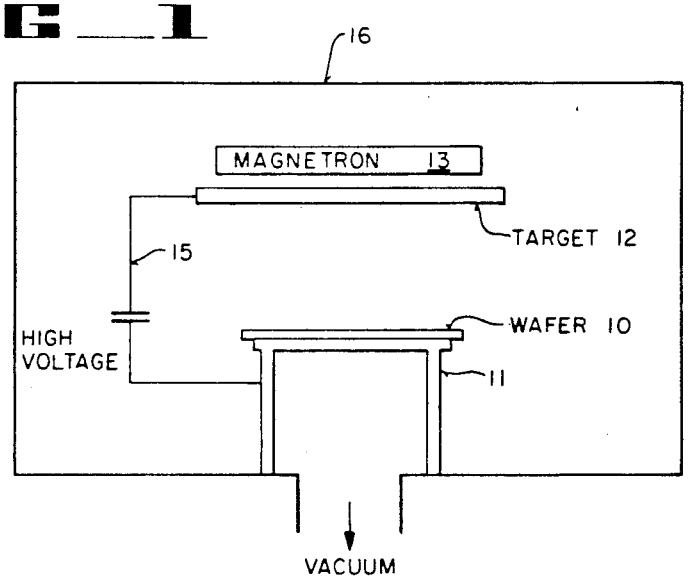
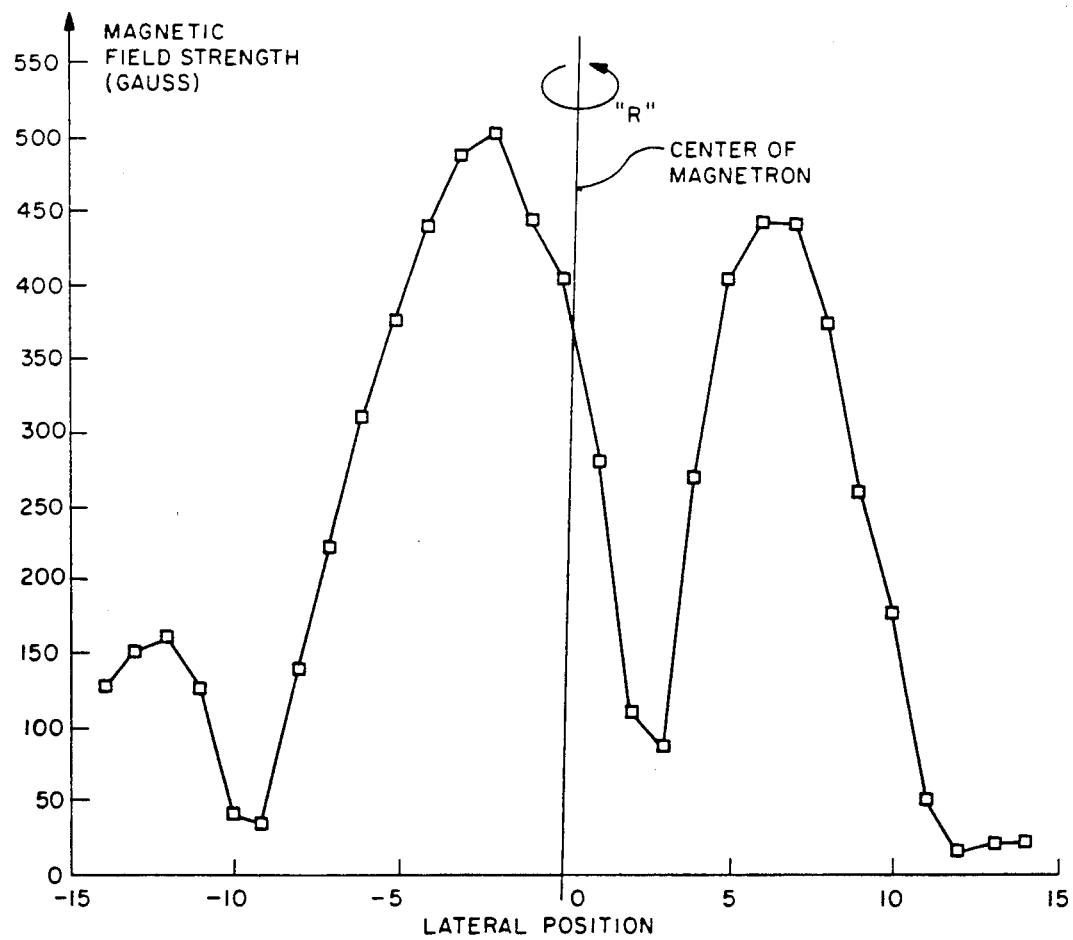

FIG_3 (PRIOR ART)
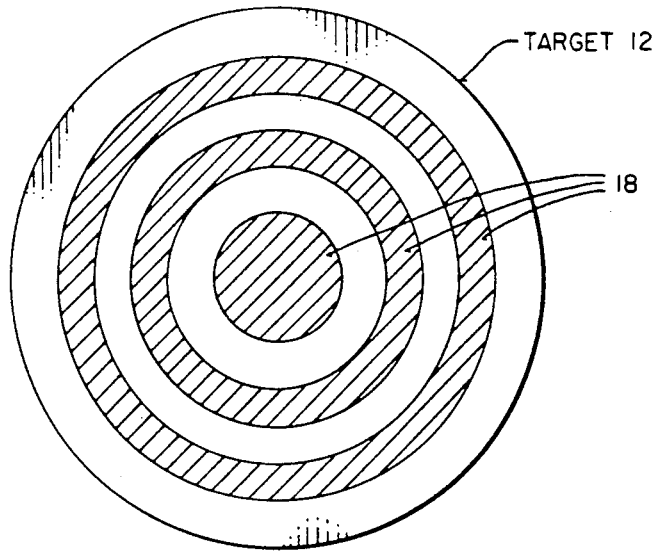
FIG_4A (PRIOR ART)
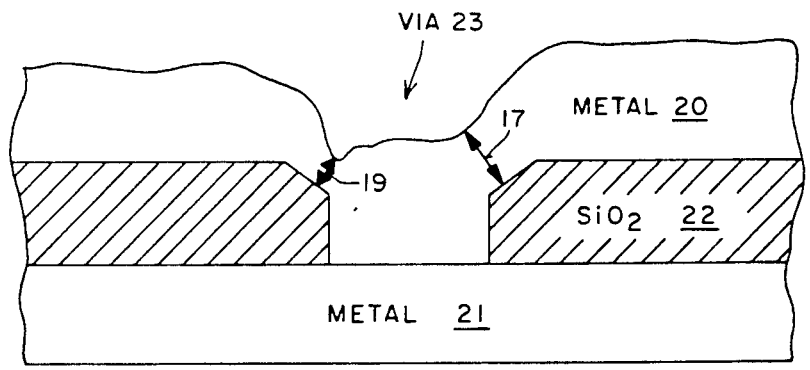
FIG_4B
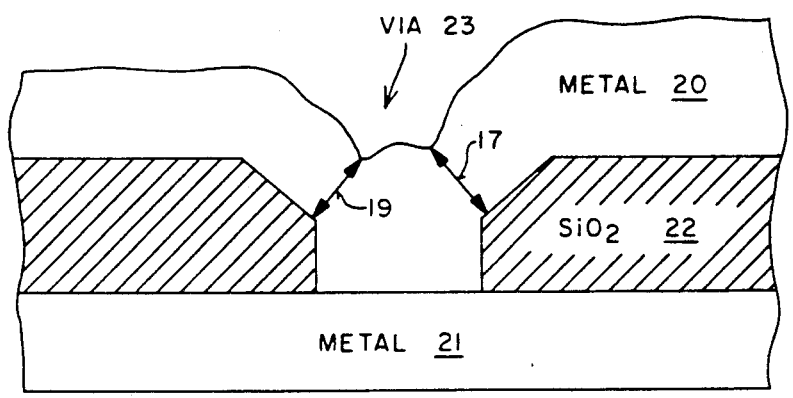

FIG_5 (PRIOR ART)
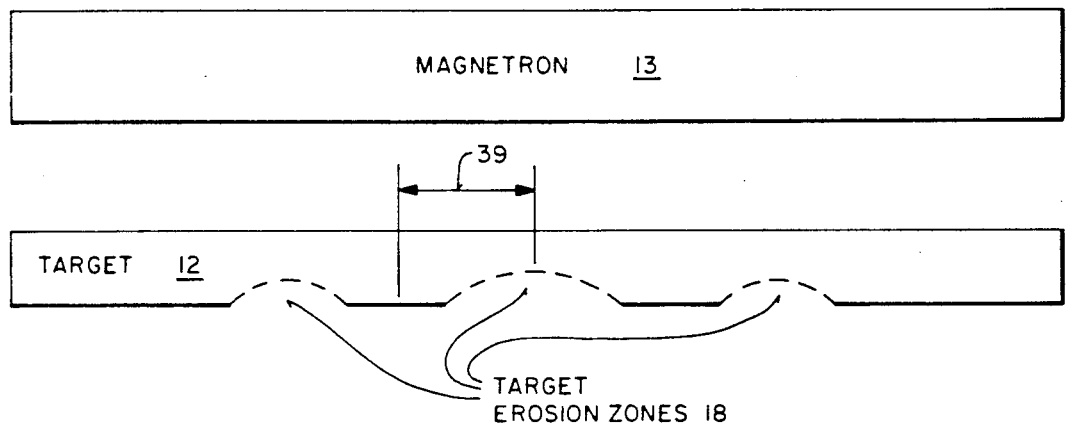
FIG_6
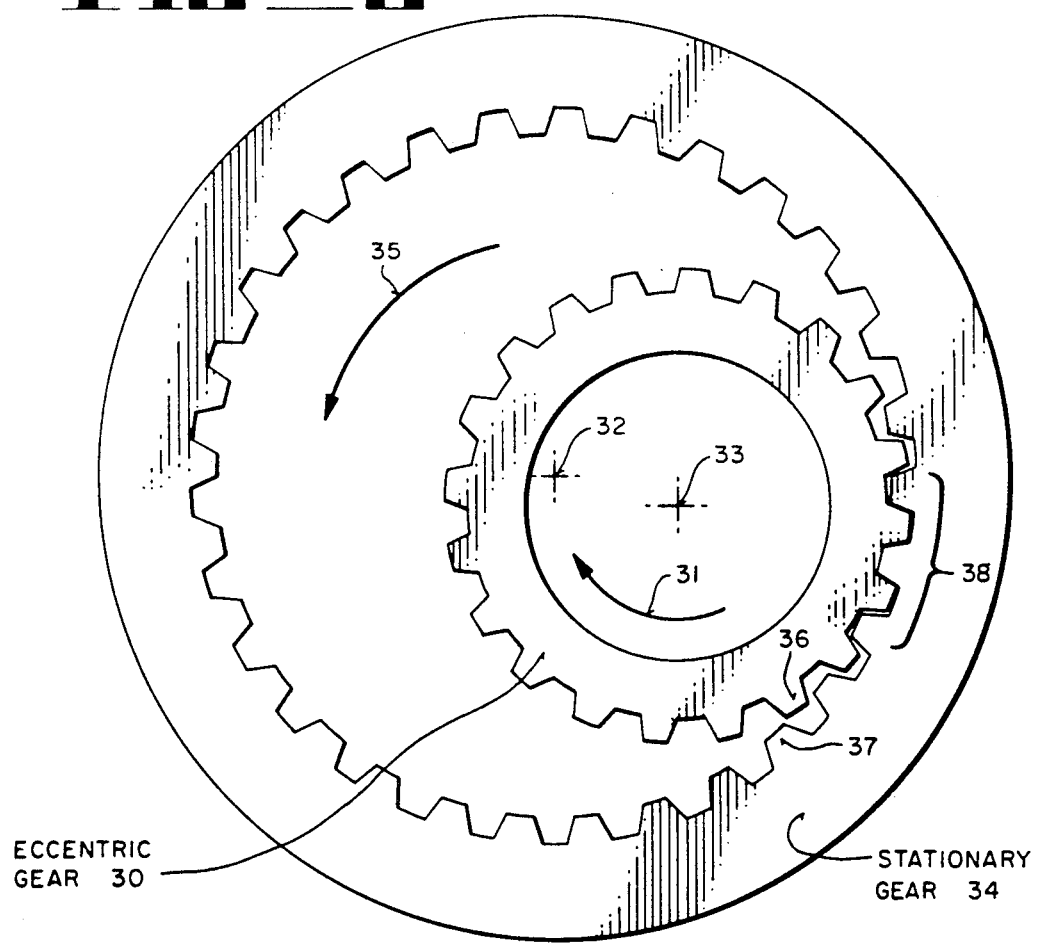

APPARATUS AND METHOD FOR ACHIEVING VIA STEP COVERAGE SYMMETRY

FIELD OF THE INVENTION

The present invention relates to the field of semiconductor processing; in particular, to methods for depositing a metal layer over a semiconductor substrate by ion sputtering.

BACKGROUND OF THE INVENTION

In the fabrication of integrated circuits, patterned metal layers are employed to provide electrical interconnection between various devices formed within the substrate. Often times, two or more metalization layers are employed as part of the interconnection scheme. Conventionally, the precess of forming metal interconnects begins by forming an insulative layer over the substrate. This layer (usually silicon dioxide) insulates the substrate from the subsequently deposited metalization layer.

Next, utilizing traditional photolithographic steps, contact openings are etched through this insulative layer to expose the underlying silicon. After a first metalization layer has been deposited and patterned, the entire substrate is covered with another insulative layer—usually silicon dioxide. Small openings, commonly referred to as "via" openings, are then etched in the second insulative layer. When a second metalization layer is subsequently deposited, these via openings establish the electrical connection points between the first and second metalization layers.

Typically, the metal layers which make up the electrical interconnects are deposited by the well-known process of sputtering. Sputtering is performed by impinging high energy ions onto a metallic target. The ions are accelerated in such a way that they bombard the target, causing metallic atoms to be released from the surface of the target. These metallic atoms are directed onto the surface of the silicon substrate where they are deposited, forming the multiple metalization layers described above. Acceleration of the ions is normally achieved by the use of high electric and magnetic fields—the magnetic field being generated by a magnetron.

A magnetron is a device consisting of a group of magnets arranged in a definite configuration. The magnetic array is typically mounted onto the back side of the metallic target so as to create a large magnetic field across the back plane of the target. The flux lines emanating from this field also extend well beyond the target's front surface.

One problem which arises in sputtering devices which use a magnetron is that the strength of the magnetic field varies non-linearly across the target surface. The result is that accelerating ions impinge the target more frequently in areas where the magnetic field is the strongest. This causes the target to erode unevenly which results in a significantly shorter target life. As is appreciated by practitioners in the art, a spatially fluctuating magnetic field is also a source of nonuniformity in the deposited metal layer. This latter effect manifests itself in a phenomena known as step coverage asymmetry. Asymmetric step coverage of the deposited metal film over via contacts results in measurement (i.e., scaling) errors during photolithographic processing. This problem is especially serious for fabrication processes which rely upon step-and-repeat exposure techniques.

Past attempts to relieve these problems have focused on rotating the magnetron about an axis centered about the target. However, rotation of the magnetron has proven ineffective in eliminating the problem of nonuniform target erosion. Instead, magnetron rotation produces an erosion pattern shaped like concentric rings across the surface of the target, each ring corresponding to the varying strength, or peaks of the magnetic field. Moreover, magnetron rotation has been ineffective at eliminating the problem of via step coverage asymmetry.

Therefore, what is needed is a means of improving the uniformity and step coverage symmetry of the deposited metalization layer while avoiding nonuniform erosion of the target.

SUMMARY OF THE INVENTION

An apparatus and method for achieving via step coverage symmetry in a process for depositing a metal layer over a semiconductor substrate by sputtering is disclosed. The magnetron sputtering apparatus of the present invention relies upon simultaneous rotational and lateral movements of the magnetron. When the magnetron is rotated and moved laterally at the same time, the uniformity of the magnetic field across the target is improved significantly compared to prior art magnetron sputtering systems. Improving the magnetic field uniformity leads to more even target surface wear and also improves the uniformity of the deposited metal film. Thus, step coverage symmetry is greatly improved.

In one particular embodiment, the rotational and lateral movement is achieved utilizing a planetary gear system which simultaneously generates lateral and rotational movement in the magnetron.

BRIEF DESCRIPTION OF THE DRAWINGS

The novel features believed characteristic of the invention are set forth in the appended claims. The invention itself however, as well as other features and advantages thereof, will be best understood by reference to the description which follows, read in conjunction with the accompanying drawings, wherein:

FIG. 1 illustrates a basic sputtering apparatus.

FIG. 2 is a graph illustrating typical variations in the strength of the magenetic field across a target.

FIG. 3 is a top view of a prior art sputtering target showing a typical erosion pattern.

FIG. 4A shows a via contact exhibiting asymmetrical metal step coverage. The via of FIG. 4A was fabricated using a prior art magnetron sputtering system.

FIG. 4B shows a via contact with symmetrical metal step coverage in accordance with the teachings of the present invention.

FIG. 5 illustrates a cross-sectional view of a target erosion pattern generated by a prior art magnetron.

FIG. 6 illustrates the planetary gear system used in the currently preferred embodiment of the present invention to achieve simultaneous lateral and rotational magnetron movement.

DETAILED DESCRIPTION OF THE PREFERRED EMBODIMENT(S)

Figure 7:
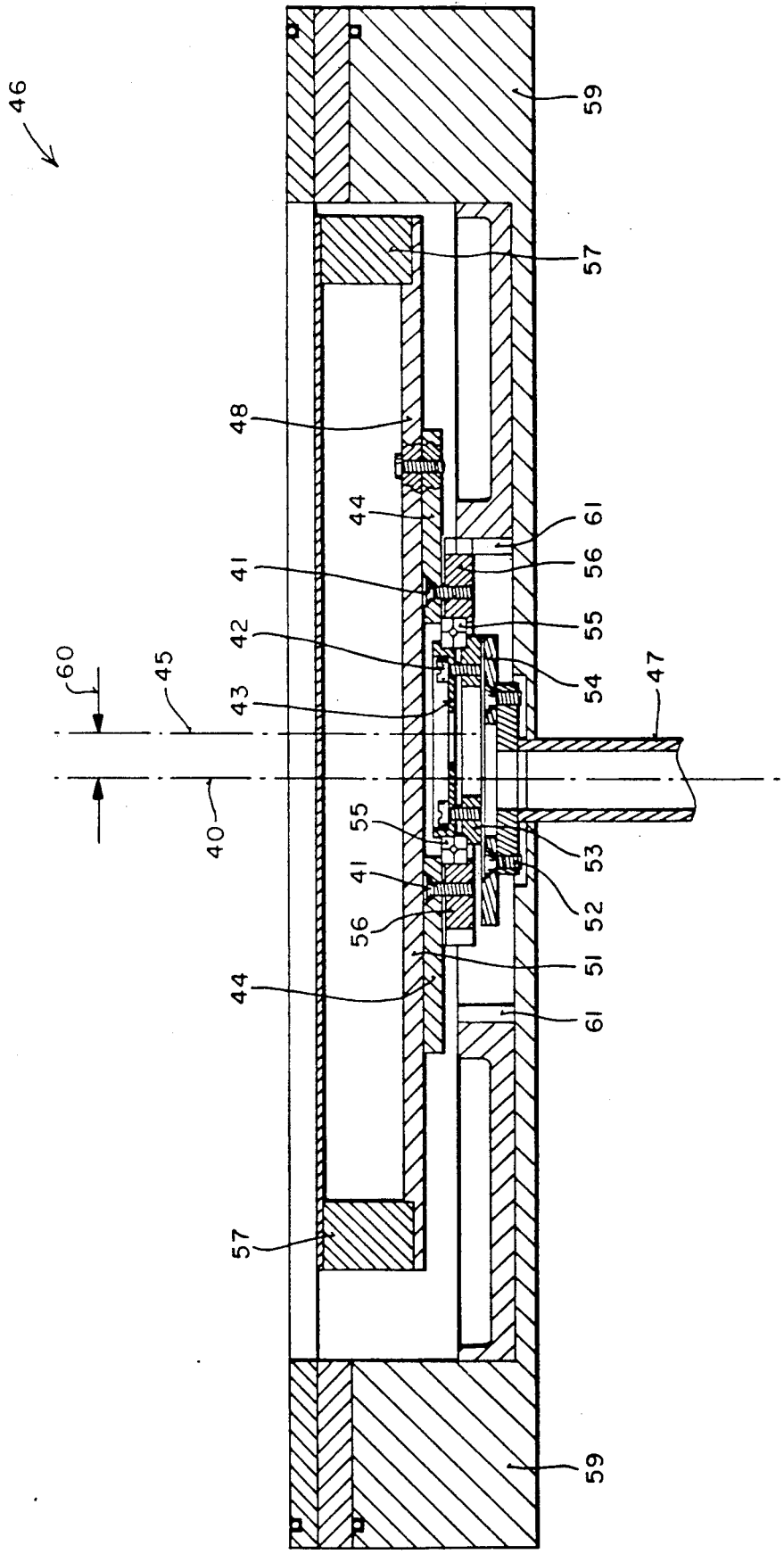
FIG. 7 is a cross-sectional view of the sputtering apparatus of the currently preferred embodiment of the present invention.

A method and apparatus for achieving symmetrical via step coverage is disclosed. In the following description, numerous specific details are set forth, such as specific material types, thicknesses, mechanical means, etc., in order to provide a thorough understanding of the invention. It will be obvious, however, to one skilled in the art that these specific details need not be used to practice the present invention. In other instances, well-known structures and processing steps have not been described in particular detail in order to avoid unnecessarily obscuring the present invention.

DISCUSSION OF THE PRIOR ART

Magnetron sputtering systems are commonly utilized to deposit metal films, such as aluminum, on semiconductor substrates. FIG. 1 shows a simple magnetron sputtering system comprising a target 12 along with an electrically grounded holder 11. A semiconductor wafer 10 is shown positioned on top of holder 11. The entire apparatus is housed in a vacuum chamber 16 into which, a noble gas (e.g., argon) is introduced to some specific pressure.

An electric field is generated by applying a high voltage 15 between target 12 and holder 11 to accelerate electrons within chamber 16. These electrons, in turn, collide with argon atoms thereby producing a pair of an electron and an argon ion. The argon ions are then accelerated towards target 12. When the argon ions strike metal target 12, they sputter some of the target atoms off. The sputtered atoms (molecules) are subsequently deposited onto substrate 10 where they condense and form a thin metallic (e.g., aluminum alloy) film.

The purpose of the magnetron 13 in the sputtering system is to make more efficient use of the electrons and cause them to produce more ionization. The crossed electric and magnetic fields trap the electrons near the target and force them into long paths thus increasing the probability of an ionizing collision with an argon atom. FIG. 2 shows a graph illustrating the varying strength of the magnetic field generated by the magnetron across the diameter of the target. As shown, the magnetic field is characterized by multiple peaks of varying strengths.

Because of the problems of nonuniform target erosion and step coverage asymmetry, prior art sputtering systems attempted to compensate for the non-uniform magnetic field by rotating magnetron 13 about its axis. The effect of the rotation of the magnetron on the target erosion is shown in FIG. 3. That is, the varying magnetic field strength produces zones of increased target erosion. These erosion zones are shown in FIG. 3 by concentric rings 18. Note, each ring of the erosion pattern in FIG. 3 corresponds to a peak of the magnetic field shown in FIG. 2 when rotated.

FIG. 5 shows, by way of example, a cross-sectional view of a target 12 which has been non-uniformly eroded as a result of rotating magnetron 13. The target erosion zones 18 in FIG. 5 correspond to the peaks of the magnetic field shown previously in FIG. 2. Distance 39 corresponds to the lateral distance between maximum and minimum magnetic field strength. Obviously, nonuniform erosion of the target surface leads to shortened target life.

The additional problem of asymmetric via step coverage is depicted in FIG. 4A, where a via 23 is shown interconnecting metal layers 20 and 21. (Silicon dioxide layer 22 acts as an insulator between layers 20 and 21 everywhere except at vias 23.) Note that the resulting via step coverage illustrated in FIG. 4A has been produced using a typical prior art rotating magnetron sputtering machine. One can clearly see the asymmetrical thicknesses 17 and 19 of metal layer 20 which have been deposited along the sides the via 23. Hence, rotation of the magnetron is inadequate at solving the problems of nonuniform target erosion and via step coverage asymmetry.

DISCUSSION OF THE PRESENT INVENTION

The present invention overcomes these problems by providing an apparatus which simultaneously generates both rotational and lateral movement in the magnetron. That is, instead of simply rotating magnetron 13 about its axis, the present invention introduces a lateral component of movement which smooths out the applied magnetic field as a function of position over time. Thus the rotational and lateral movement components effectively "smear" the magnetic field peaks (see FIG. 2) across the target radius. The end result is a nearly ideal uniform target sputtering erosion pattern and virtual via step coverage symmetry.

By way of example, FIG. 4B illustrates the improved metal step coverage symmetry of a via 23 deposited in accordance with the present invention. Note the nearly symmetrical thicknesses 17 and 19 present along the side portions of via 23.

FIG. 6 is a top view of the magnetron gear system employed in the currently preferred embodiment of the present invention. The mechanical means of FIG. 6 comprises eccentric gear 30, which moves centered above an axis 33. Gear 30 resides within a larger stationary gear 34. Together gears 30 and 34 function as a planetary gear system. That is, as eccentric gear 30 travels along the inside radius of stationary gear 34 in a direction indicated by arrow 35, it also rotates about its own axis 33. Thus, axis point 33 orbits the stationary axis 32 of gear 34 while eccentric gear 30 itself rotates in a direction 31 about axis 33.

Note that in the currently preferred embodiment, magnetron 13 is mounted directly to eccentric gear 30. Therefore, magnetron 13 experiences the identical rotational and lateral components of movement as does gear 30. The net effect of the planetary gear system of FIG. 6 is to smooth out the magnetic field peaks across the radius of the target as a function of time. Effectively, this simulates a uniform magnetic field extending across the target surface.

Referring now to FIG. 7, a cross-sectional view of the planetary gear system employed in conjunction with the present invention is shown. The planetary magnetron 46 of FIG. 7 comprises magnets 57 positioned within a magnetron backing plate 48. The housing is bolted to an adapter plate 44 which, in turn, is bolted to eccentric gear 56 using bolts 41. Eccentric gear 56 is mounted via bearings 55 to bearing housing 43. Note that bearing housing 43 and eccentric gear 56 share the same center axis 45. Bolts 42 fixedly attach the top bearing housing 43 to the bottom of bearing housing 53. Bottom bearing housing 53 in turn is fixedly attached to eccentric disk 54. Eccentric disk 54 is similarly bolted to shaft 47 using screws 52. Shaft 47 is centered about axis 40 and coupled to a motor which provides a means for rotating shaft 47 about its axis.

As rotational movement is imparted to eccentric disk 54 via shaft 47, eccentric gear teeth 56 engage the teeth of stationary gear 61. Note that stationary gear 61 is also centered about axis 40. Stationary gear 61 is securely mounted within magnetron housing 59. For the embodiment of FIG. 7, the sputtering target rests on top of planetary magnetron 46.

The target used in conjunction with the currently preferred embodiment is one manufactured by Johnson-Mathey and comprises either aluminum, titanium, titanium tungsten or some similar metal alloy. The planetary magnetron 46 was adapted from a magnetron known as the Anelva 1015i, manufactured by Anelva of Japan.

With continuing reference to FIG. 7, the displacement of axis 45 of the eccentric gear 56 from the axis 40 of shaft 47 and stationary gear 61 is particularly important in the preferred embodiment of the present invention. The distance 60 separating axis 40 from axis 45 is selected based on the magnetic field strength characteristics, such as those shown in FIG. 2. Because the magnetic field strength of the magnetron is characterized by a series of magnetic flux peaks, distance 60 is calculated to be approximately one half of the distance between maximum and minimum magnetic field strength points. In other words, distance 60 is one half of distance 39—the distance separating the maximum to minimum target erosion zones 18 characteristic of a prior art sputtering system.

By displacing axis 45 from axis 40, the magnetic field is also shifted during its planetary rotation such that the valleys between the magnetic field peaks shown in FIG. 2 are, in effect, "filled in" or smoothed over as a function of time. Consequently, the net effect is to simulate a uniform field across the target.

Optimally, the peaks of the magnetic field are shifted a predetermined distance such that the magnetic field across the target is essentially uniform. In the currently preferred embodiment, distance 60 is approximately 10.6 millimeters. For this embodiment, shaft 47 rotates at approximately 20 rpms—with the magnetron itself rotating at approximately 4 rpms due to the planetary gear mechanism. Higher shaft speeds do not diminish the improvements in via step coverage symmetry and uniform target erosion which are characteristic of the presently invented sputtering system.

Utilizing the planetary magnetron of the present invention, target life has been improved from a life time of approximately 1000 kilowatt hours (associated with prior art sputtering machines) to approximately 2000 kilowatt hours with the planetary magnetron device of the present invention. As previously discussed, the present invention results in significant improvement in via step coverage symmetry. Thus the overall uniformity of depositions across the semiconductor substrate is significantly better using the present invention.

Although the present invention has been described in conjunction with one specific embodiment, it is appreciated that the present invention may be used in other embodiments. Consequently, it is to be understood that the particular embodiments shown and described by way of illustration are in no way intended to be considered limiting. For instance, there are a variety of well-known means for generating lateral and rotational movement in the mechanical arts. Therefore, the reference to the details of the preferred embodiment are not intended to limit the scope of the claims which themselves recite only those features regarded as essential to the invention.

We claim:

1. In a sputtering apparatus utilizing a magnetron, a method for uniformly sputtering a target with ions, comprising the steps of:
    applying a rotational motion to said magnetron;
    simultaneously moving said magnetron in a lateral motion, wherein said rotational motion and said lateral motion are achieved by utilizing a planetary gear mechanism, said gear mechanism comprising a first gear centered about a first axis and having a plurality of gear teeth disposed about an outer radius and a stationary second gear centered about a second axis having a plurality of gear teeth disposed about an inner radius, the gear teeth of said first and second gears being engaged such that said first and second axes are displaced a predetermined distance which optimizes the sputtering uniformity of said target.

2. In a magnetron sputtering apparatus having a magnetron and a target, a method for uniformly sputtering said target with ions, comprising the steps of:
    rotating said magnetron about a first axis of rotation;
    simultaneously orbiting said magnetron about a second axis in a planetary manner such that said magnetron experiences both lateral and rotational movements, wherein said first axis and said second axis are offset a distance approximately equal to half the distance between maximum and minimum field strength points of a magnetic field generated by said magnetron.

3. A magnetron sputtering apparatus including a chamber enclosing a target spaced-apart from a substrate and a means for sputtering atoms off of said target and depositing said atoms onto said substrate, said means including a magnetron positioned near said target for generating a magnetic field having varying field intensity extending across said target, an improvement which comprises a gear system including a first gear having a first axis and a second gear having a second axis for simultaneously moving said magnetron rotationally and laterally such that said axis of said first gear and said axis of said second gear are offset a predetermined distance approximately equal to one-half the distance between maximum and minimum field strength points in said magnetic field.

4. The improvement of claim 3 wherein said gear system comprises a planetary gear system.

5. The improvement of claim 4 wherein said gear system comprises eccentric and stationary gears, said eccentric gear being fixedly attached to said magnetron.

6. The improvement of claim 5 wherein said gear system further comprises a shaft coupled to said eccentric gear and a means for rotating said shaft, thereby producing rotational movement in said eccentric gear.

* * * * *

UNITED STATES PATENT AND TRADEMARK OFFICE
CERTIFICATE OF CORRECTION

PATENT NO. : 5,126,029
DATED : June 30, 1992
INVENTOR(S) : Yigal Tomer and Yigal Dafne It is certified that error appears in the above-indentified patent and that said Letters Patent is hereby corrected as shown below:

Column 1, line 18        Delete "precess"        Insert --process--

Signed and Sealed this

Sixteenth Day of August, 1994

BRUCE LEHMAN

Attest:

Attesting Officer        Commissioner of Patents and Trademarks